(12) United States Patent
Kim (10) Patent No.: US 9,472,779 B2
(45) Date of Patent: *Oct. 18, 2016

(54) FLEXIBLE DISPLAY HAVING A CRACK SUPPRESSING LAYER

(71) Applicant: SAMSUNG DISPLAY CO., LTD., Yongin, Gyeonggi-Do (KR)

(72) Inventor: Kwang-Nyun Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/300,765

(22) Filed: Jun. 10, 2014

(65) Prior Publication Data
US 2015/0048329 A1 Feb. 19, 2015

(30) Foreign Application Priority Data
Aug. 13, 2013 (KR) .................. 10-2013-0096161

(51) Int. Cl.
H01L 51/52 (2006.01)
H01L 27/32 (2006.01)
H01L 51/56 (2006.01)
H01L 51/00 (2006.01)

(52) U.S. Cl.
CPC ....... H01L 51/5253 (2013.01); H01L 27/3244 (2013.01); H01L 51/0097 (2013.01); H01L 51/524 (2013.01); H01L 51/56 (2013.01); H01L 2251/5338 (2013.01); H01L 2251/566 (2013.01)

(58) Field of Classification Search
CPC ............................. H01L 51/50; H01L 51/56
USPC ............................................. 257/40, 88, 100
See application file for complete search history.

(56) References Cited

U.S. PATENT DOCUMENTS

| 9,190,630 B2* | 11/2015 | Kim ..................... H01L 51/56 |
| 2005/0197030 A1* | 9/2005 | Yamazaki et al. ............. 445/24 |
| 2006/0022592 A1* | 2/2006 | Boroson ...................... 313/512 |
| 2007/0273271 A1 | 11/2007 | Yamazaki et al. |
| 2011/0120755 A1 | 5/2011 | Lee et al. |
| 2011/0156062 A1 | 6/2011 | Kim et al. |
| 2014/0097430 A1* | 4/2014 | Park et al. ..................... 257/48 |
| 2014/0131683 A1* | 5/2014 | Kim .................. H01L 51/5253 257/40 |
| 2014/0353625 A1* | 12/2014 | Yi et al. ......................... 257/40 |
| 2015/0036299 A1* | 2/2015 | Namkung ......... G02F 1/133345 361/749 |

FOREIGN PATENT DOCUMENTS

| JP | 2007-180515 | 7/2007 |
| KR | 10-2009-0121894 | 11/2009 |
| KR | 10-2013-0005877 | 1/2013 |

OTHER PUBLICATIONS

Extended Europena Search Report dated Jan. 29, 2015 of corresponding European Patent Application No. 14179213.5.

* cited by examiner

*Primary Examiner* — Lex Malsawma
*Assistant Examiner* — J. R. Oakley
(74) *Attorney, Agent, or Firm* — F. Chau & Associates, LLC (57) ABSTRACT

A flexible display may suppress a generation of cracks in an inorganic layer and suppress the spread of cracks. A flexible display includes a flexible substrate and an inorganic layer formed on the flexible substrate. A display unit is formed on the inorganic layer. The display unit includes a plurality of pixels. Each pixel includes an organic light emitting diode. A thin film encapsulation layer covers the display unit. A crack suppressing layer is formed along the edge of the flexible substrate. The crack suppressing layer is disposed on the inorganic layer at an exterior side of the thin film encapsulation layer.

17 Claims, 7 Drawing Sheets

FLEXIBLE DISPLAY HAVING A CRACK SUPPRESSING LAYER

CROSS-REFERENCE TO RELATED APPLICATION

This application claims priority under 35 U.S.C. §119 to Korean Patent Application No. 10-2013-0096161 filed in the Korean Intellectual Property Office on Aug. 13, 2013, the disclosure of which is incorporated by reference herein in its entirety.

(A) Technical Field

The present disclosure relates to a flexible display, and more specifically, to a flexible display device.

(B) Discussion of Related Art

A flat panel display may be formed of a substrate and a display unit including a plurality of pixels formed on the substrate. The flat panel display may have a bending characteristic when the substrate is formed of a flexible substrate such as a plastic film and not a rigid substrate such as glass. The flexible display device may be a self-emissive organic light emitting diode (OLED) display.

The flexible display device may be manufactured through a process in which a plurality of display units and a plurality of thin film encapsulation layers are formed on a flexible mother board. An upper protection film and a lower protection film may be layered in the flexible mother board. The plurality of thin film encapsulation layers may be separated to individual flexible displays by cutting between the plurality of thin film encapsulation layers. The upper protection film, the lower protection film, and the flexible mother board may be cut through a press method using a cutting knife.

A strong press cutting force may be transmitted to the flexible display and at substantially the same time a bending force may be applied to the flexible display during the cutting process.

SUMMARY

Exemplary embodiments of the present invention provide a flexible display that may minimize a generation of cracks during a cutting process and prevent a failure such as, for example, panel contraction by preventing a spread of cracks toward a thin film encapsulation layer.

A flexible display according to an exemplary embodiment of the present invention includes a flexible substrate and an inorganic layer formed on the flexible substrate. A display unit is formed on the inorganic layer. The display unit includes a plurality of pixels. Each pixel includes an organic light emitting diode. A thin film encapsulation layer covers the display unit. The crack suppressing layer is disposed on the inorganic layer at an external side of the thin film encapsulation layer.

The crack suppressing layer may be configured to contact the edge of the flexible substrate. The crack suppressing layer may be disposed at an uppermost edge of the flexible substrate.

The inorganic layer may include a barrier layer, a buffer layer, a gate insulating layer, and an interlayer insulating layer.

The barrier layer, the buffer layer, the gate insulating layer, and the interlayer insulating layer may cover an entire top surface of the flexible substrate.

The barrier layer and the buffer layer may cover an entire top surface of the flexible substrate. The gate insulating layer and the interlayer insulating layer may be disposed at an inner side of the crack suppressing layer. The gate insulating layer and the interlayer insulating layer may be formed at a constant distance from the edge of the flexible substrate.

The crack suppressing layer may be formed at an inner side of the flexible substrate. The crack suppressing layer may cover a portion of the inorganic layer. The inorganic layer may include a barrier layer, a buffer layer, a gate insulating layer, and an interlayer insulating layer.

The barrier layer and the buffer layer may cover an entire top surface of the flexible substrate. The gate insulating layer and the interlayer insulating layer may be disposed at an inner side of the crack suppressing layer at a constant distance from the edge of the flexible substrate.

The barrier layer, the buffer layer, the gate insulating layer, and the interlayer insulating layer may be formed at an inner side of the crack suppressing layer between the edge of the flexible substrate and the crack suppressing layer.

The crack suppressing layer may include an organic material.

The display unit may include a planarization layer and a pixel defining layer. The crack suppressing layer may include a same material as at least one of the planarization layer and the pixel defining layer.

The crack suppressing layer may include a first layer including a same material as the planarization layer and a second layer including a same material as the pixel defining layer.

The crack suppressing layer may include a UV curable resin and/or a thermosetting resin.

According to exemplary embodiments of the present invention, a loss of encapsulation function of the thin film encapsulation layer due to the spread of cracks may be prevented. Panel contraction and display failure may be prevented.

BRIEF DESCRIPTION OF THE DRAWINGS

The above and other features of the inventive concept will become more apparent by describing in detail exemplary embodiments thereof, with reference to the accompanying drawings in which.

DETAILED DESCRIPTION OF THE EMBODIMENTS

The present invention will be described more fully hereinafter with reference to the accompanying drawings, in which exemplary embodiments of the invention are shown.

As those skilled in the art will realize, the described embodiments may be modified in various different forms without departing from the spirit or scope of the present invention.

It will be understood that when an element such as a layer, film, region, or substrate is referred to as being "on" another element, it may be directly on the other element or intervening elements may be present.

Figure 1:
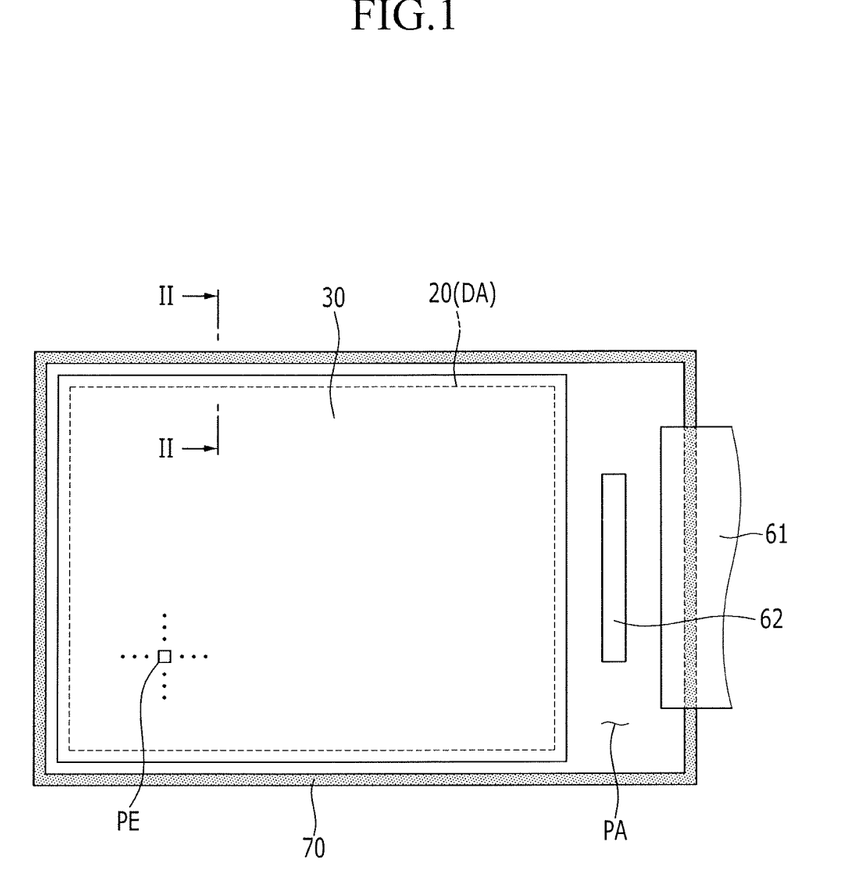
FIG. 1 is a top plan view of a flexible display according to an exemplary embodiment of the present invention.
Figure 2:
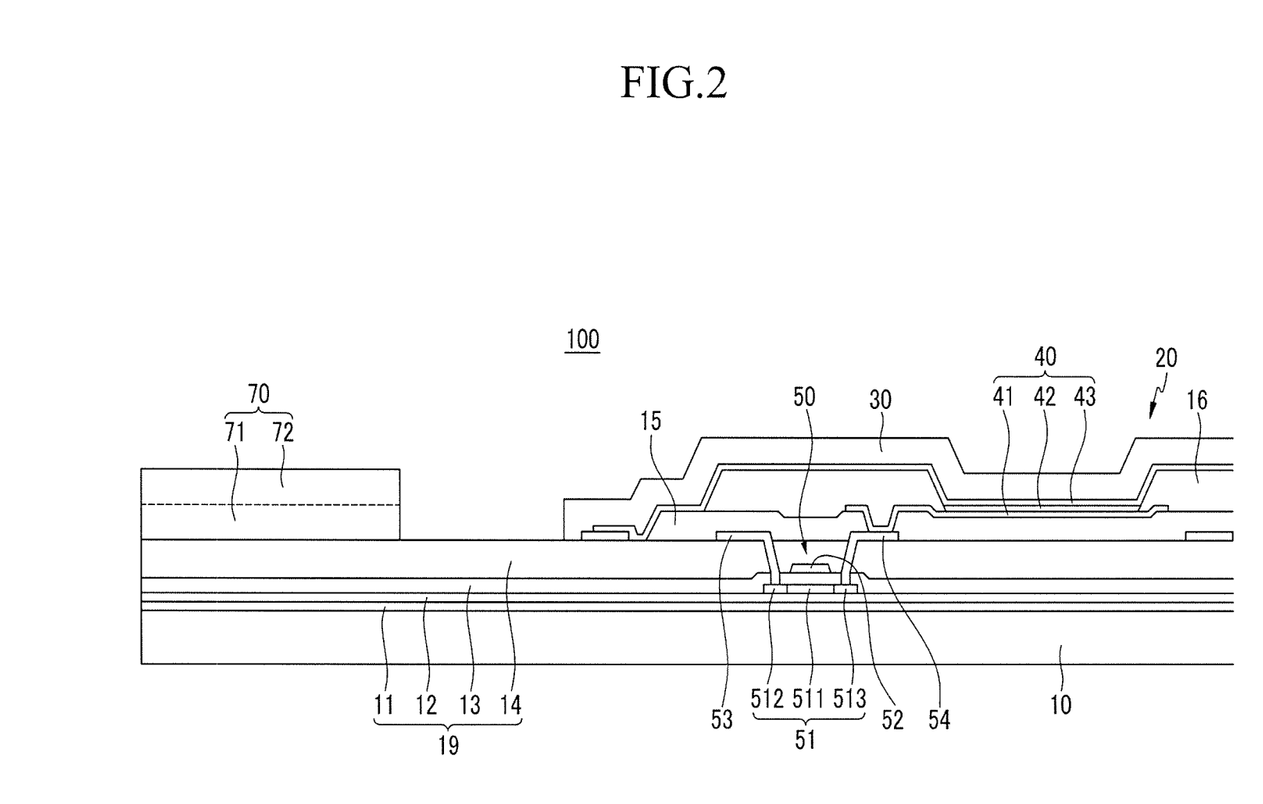
FIG. 2 is a partial cross-sectional view, cut along the line II-II of FIG. 1.

FIG. 1 is a top plan view of a flexible display according to an exemplary embodiment of the present invention, and FIG. 2 is a partial cross-sectional view of FIG. 1 taken along the line II-II.

Referring to FIG. 1 and FIG. 2, a flexible display 100 according to an exemplary embodiment of the present invention includes a flexible substrate 10, a display unit 20 formed on the flexible substrate 10, and a thin film encapsulation layer 30. The thin film encapsulation layer 30 may cover the display unit 20. The display unit 20 may include a plurality of pixels PE. The display unit 20 may display an image with a combination of light emitted from each of the plurality of pixels PE. Each pixel PE may include a pixel circuit and an organic light emitting diode (OLED) 40. Light emitted from the OLED 40 may be controlled by the pixel circuit.

The flexible substrate 10 may include a plastic film such as, for example, a polyimide or a polycarbonate. When the plastic film has a higher moisture transmission rate and higher oxygen transmittance than glass, transmittance of external moisture and oxygen through the flexible substrate 10 may be blocked. A barrier layer 11 and a buffer layer 12 may be formed on the flexible substrate 10.

The barrier layer 11 may be formed of a plurality of inorganic layers, and for example, a silicon oxide layer and/or a silicon nitride layer. The plurality of inorganic layers may be alternately and repeatedly stacked. When the barrier layer 11 has a lower moisture transmission rate and lower oxygen transmittance than the flexible substrate 10 that may be formed of the plastic film, moisture and oxygen transmitted through the flexible substrate 10 may be suppressed from permeating into the display unit 20.

The buffer layer 12 may be an inorganic layer, and may include, for example, a silicon oxide or a silicon nitride. The buffer layer 12 may provide a flat surface for forming the pixel circuit. The buffer layer 12 may suppresses permeation of moisture and foreign particles into the pixel circuit and the OLED 40.

A thin film transistor 50 and a capacitor (not shown) may be formed on the buffer layer 12. The thin film transistor 50 may include a semiconductor layer 51, a gate electrode 52, a source electrode 53, and/or a drain electrode 54.

The semiconductor layer 51 may include a polysilicon or oxide semiconductor. The semiconductor layer 51 may include a channel area 511 in which impurities are not doped, a source area 512 and a drain area 513 in which impurities are doped at respective sides of the channel area. When the semiconductor layer 51 is formed of the oxide semiconductor, a separate protective layer for protecting the semiconductor layer 51 may be added.

A gate insulating layer 13 may be formed between the semiconductor layer 51 and the gate electrode 52. An interlayer insulating layer 14 may be formed between the gate electrode 52 and the source and drain electrodes 53 and 54. The gate insulating layer 13 and the interlayer insulating layer 14 may be inorganic layers.

The thin film transistor 50 shown in FIG. 2 may be a driving thin film transistor. The pixel circuit may include a switching thin film transistor (not shown). The switching thin film transistor may be a switching element that selects a pixel for light emission. The driving thin film transistor may apply power for light emission of the selected pixel to the corresponding pixel.

In FIG. 2, the thin film transistor 50 may be formed with a top gate structure, for example, but the structure of the thin film transistor 50 is not limited thereto. The pixel circuit may include three or more thin film transistors and two or more capacitors.

A planarization layer 15 may be formed on the source and drain electrodes 53 and 54. The planarization layer 15 may include an organic material. The planarization layer 15 may include, for example, an acryl resin, an epoxy resin, a phenolic resin, a polyamide resin, and the like. The planarization layer 15 may have a via hole that partially exposes the drain electrode 54. The OLED 40 may be formed on the planarization layer 15.

The OLED 40 may include a pixel electrode 41, an organic emission layer 42, and a common electrode 43. The pixel electrode 41 may be formed in each pixel. The pixel electrode 41 may be connected with the drain electrode 54 of the thin film transistor 50. The common electrode 43 may be formed throughout a display area DA of the flexible substrate 10. The pixel electrode 41 may be surrounded by the pixel defining layer 16. The pixel defining layer 16 may partition pixel areas. The organic emission layer 42 may be formed on the exposed pixel electrode 41. The pixel defining layer 16 may be formed of an organic material such as, for example, a polyimide.

The organic emission layer 42 may be a red emission layer, a green emission layer, or a blue emission layer. The organic emission layer 42 may be a single white emission layer. The organic emission layer 42 may have a layered structure of a red emission layer, a green emission layer, and/or a blue emission layer. When the organic emission layer 52 has the layered structure, a color filter (not shown) may be included.

One of the pixel electrode and the common electrode may be a hole injection electrode (anode) and the other may be an electron injection electrode (cathode). Holes injected from the anode and electrons injected from the cathode may be combined in the organic emission layer 42 to generate excitons. Light may be emitted while the excitons discharge energy.

A hole injection layer and/or a hole transport layer may be disposed between the anode and the organic emission layer 42. An electron injection layer and/or an electron transport layer may be disposed between the cathode and the organic emission layer 42. The hole injection layer, the hole transport layer, the electron transport layer, and the electron injection layer may be formed on the entire display area DA of the flexible substrate 10.

One of the pixel electrode 41 and the common electrode 43 may be formed of a metal reflective layer and the other may be formed of a semi-transmissive layer or a transparent conductive layer, for example. Light emitted from the organic emission layer 42 may be reflected by the metal reflective layer. Light emitted from the organic emission layer 42 may then be emitted to the outside through the semi-transmissive layer or the transparent conductive layer. When light is emitted by the semi-transmissive layer, light emitted from the organic emission layer 42 may be partially reflected to the reflective layer such that a resonance structure is formed.

The thin film encapsulation layer 30 may encapsulate the OLED 40 from the external environment. The encapsulation layer 30 may reduce deterioration of the OLED 40 due to moisture and oxygen. The thin film encapsulating layer 30 may have a configuration in which a plurality of organic layers and a plurality of inorganic layers are alternately stacked one by one.

The organic layer of the thin film encapsulating layer 30 may include a polymer. The organic layer of the thin film encapsulating layer 30 may be a single layer or a stacked layer formed of, for example, polyethylene terephthalate, a polyimide, a polycarbonate, an epoxy, polyethylene, and/or a polyacrylate. The inorganic layer of the thin film encapsulating layer 30 may be a single layer or a stacked layer containing a metal oxide or a metal nitride. For example, the inorganic layer may contain any one of SiNx, $Al_2O_3$, $SiO_2$, and $TiO_2$.

The flexible substrate 10 may include a display area DA where the display unit 20 and the thin film encapsulation layer 30 are disposed. The flexible substrate 10 may include a pad area PA disposed at an exterior side of the thin film encapsulation layer 30. Pad electrodes (not shown) connected with the pixel circuit may be disposed in the pad area PA. The pad electrodes may be electrically connected with a chip on film 61 attached to the pad area PA or a flexible printed circuit board, for example. In FIG. 1, reference numeral 62 denotes an integrated circuit chip installed in the pad area PA.

In the flexible display 100, the inorganic layer 19 including the barrier layer 11, the buffer layer 12, the gate insulating layer 13, and the interlayer insulating layer 14 may be formed over the entire upper surface of the flexible substrate 10. The thin film encapsulation layer 30 may be disposed at an inner side separated by a constant distance from the edge of the flexible substrate 10 such that the inorganic layer 19 is exposed to the outside of the thin film encapsulation layer 30. The thin film encapsulation layer 30 may be disposed at an inner side of the flexible substrate 10. There may be a gap of about 600 μm to about 700 μm between the thin film encapsulation layer 30 and the flexible substrate 10.

Figure 3:
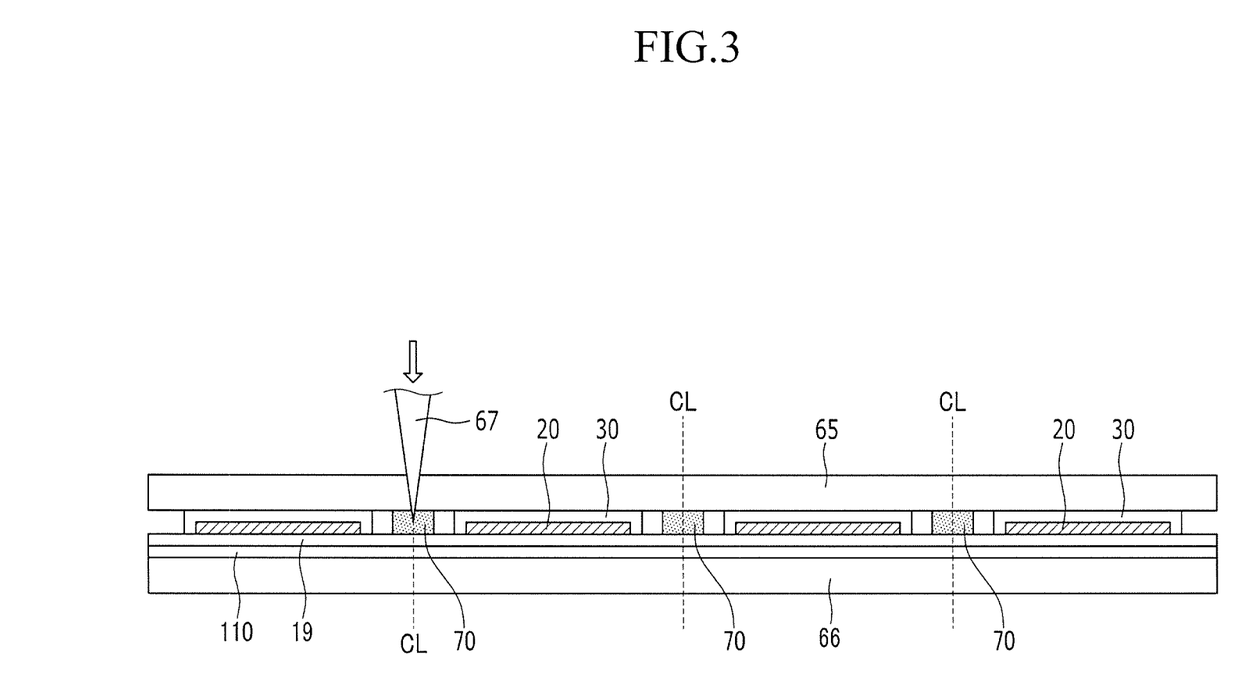
FIG. 3 is a schematic cross-sectional view showing a method of manufacturing the flexible display according to an exemplary embodiment of the present invention.

FIG. 3 is a schematic cross-sectional view showing a method of manufacturing the flexible display according to an exemplary embodiment of the present invention.

Referring to FIG. 3, the flexible display 100 may be manufactured through a process in which a plurality of display units 20 and a plurality of thin film encapsulation layers 30 are formed on a flexible mother board 110. An upper protection film 65 and a lower protection film 66 may be layered in the flexible mother board 110. The flexible mother board 110 may be cut into individual flexible displays by cutting between the plurality of thin film encapsulation layers 30. The upper protection film 65 and the lower protection film 66 may be removed from the separated flexible displays.

The upper protection film 65 and the lower protection film 66 may include a plastic film and/or an adhesive layer, for example.

When cutting the flexible mother board 110, a wheel cutting method or a laser cutting method used to cut a rigid substrate such as glass, for example, need not be used. For example, when the wheel cutting method is used, the upper protection film 65 and the lower protection film 66 may be torn during the cutting process. For example, when the laser cutting method is used, the OLED 40 may be damaged in an initial stage due to heat from laser irradiation. The flexible mother board 110 may be cut through a press method using a cutting knife 67.

A cutting force of about 5 tons to about 15 tons may be applied to the flexible mother board 110 during the cutting process so that stress is concentrated to the inorganic layer 19 disposed in the cutting line CL. The cutting knife 67 may penetrate the upper protection film 65 and directly cut the inorganic layer 19. A bending stress may be generated in the flexible mother board 110. An inorganic layer 19 that is brittle may be damaged, thereby generating cracks.

Referring to FIG. 1 to FIG. 3, the flexible display 100 according to exemplary embodiments of the present invention includes a crack suppressing layer 70. The crack suppressing layer 70 may be formed along the edge of the flexible display 10 on the inorganic layer 19 at an external side of the thin film encapsulation layer 30. The crack suppressing layer 70 may contact an edge the flexible substrate 10 corresponding to the cutting line CL. The crack suppressing layer 70 may be disposed at the uppermost edge of the flexible substrate 10.

In the external side of the display area DA, the crack suppressing layer 70 may contact the thin film encapsulation layer 30 or may be disposed at a desired distance from the thin film encapsulation layer 30. In the external side of the pad area PA, the crack suppressing layer 70 may be a desired width along the edge of the flexible substrate 10.

The crack suppressing layer 70 may include an organic material that is the same organic material as is included in at least one of the planarization layer 15 and/or the pixel defining layer 16. The crack suppressing layer 70 may include a first layer 71. The first layer 71 may include the same material as the planarization layer 15. The crack suppressing layer 70 may include a second layer 72. The second layer 72 may include the same material as the pixel defining layer 16. The width of the first layer 71 may be equal to or greater than the width of the planarization layer 15, and the width of the second layer 72 may be equal to or greater than the width of the pixel defining layer 16.

The crack suppressing layer 70 may be formed at the same time as the planarization layer 15 and the pixel defining layer 16. An additional pattern mask need not be used to form the crack suppressing layer 70. The first layer 71 and the planarization layer 15 may be formed at the same time, and the second layer 72 and the pixel defining layer 16 may be formed at the same time.

When the crack suppressing layer 70 formed of an organic material is disposed at the uppermost edge of the flexible substrate 10, the cutting knife 67 may first contact the crack suppressing layer 70 rather than the inorganic layer 19 in the cutting process shown in FIG. 3. The crack suppressing layer 70 may function as a buffering member for the inorganic layer 19 disposed below the crack suppressing layer 70. The crack suppressing layer 70 may function as a buffering member at the moment the cutting knife 67 contacts that crack suppressing layer 70 or the inorganic layer 19, and generation of cracks in the inorganic layer 19 may be minimized.

Two organic structures (e.g., the crack suppressing layer 70 and the flexible substrate 10) may support the inorganic layer 19 at the edge of the flexible substrate 10 that corresponds to the cutting line CL. The spread of the cracks to the thin film encapsulation layer 30 through the inorganic layer 19 may be prevented. A loss of an encapsulation function of the thin film encapsulation layer 30 due to the spread of cracks may be prevented. Panel contraction and a display failure may be prevented.

The crack suppressing layer may include a UV curable resin or a thermosetting resin used as a sealant. For example, the UV curable resin may be a polyester resin containing a radical initiator, an epoxy resin, a urethane resin, a polyether resin, or a polyacryl resin. For example, the thermosetting resin may be an epoxy resin, an amino resin, a phenol resin, or a polyester resin.

For example, the sealant may be more resistant to an external impact than the planarization layer 15 and the pixel defining layer 16. The crack suppressing layer 70 formed of the sealant may reduce the impact applied during the cutting process.

Figure 4:
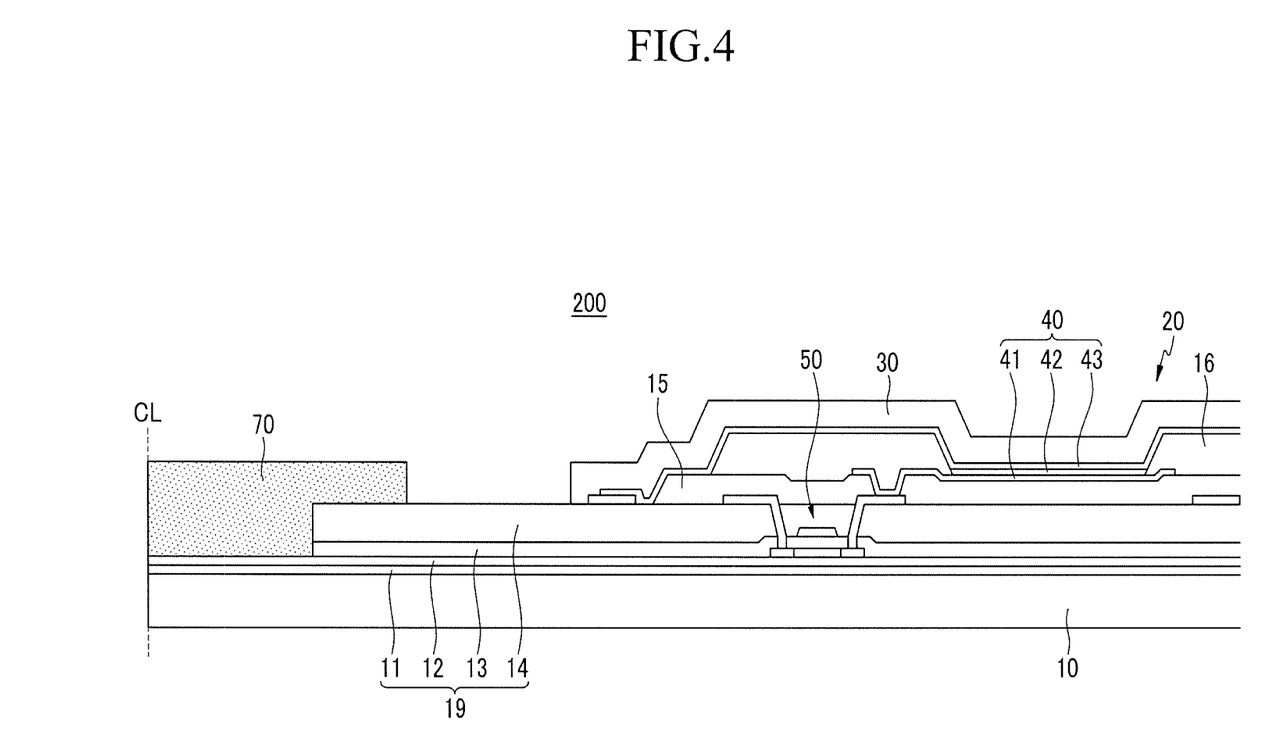
FIG. 4 is a partially enlarged cross-sectional view of a flexible display according to an exemplary embodiment of the present invention.

FIG. 4 is a partially enlarged cross-sectional view of a flexible display according to an exemplary embodiment of the present invention.

Referring to FIG. 4, a flexible display 200 according to an exemplary embodiment of the present invention is the same as the flexible display of the exemplary embodiment of FIGS. 1 and 2, except that a part of an inorganic layer 19 is disposed at an inner side of the flexible substrate 10 with a gap between the edge of the flexible substrate 10 and the inorganic layer 19. The same reference numerals may be used for the same components as those of the exemplary embodiment of the present invention of FIGS. 1 and 2.

A barrier layer 11 and a buffer layer 12 may be formed over an entire top surface of the flexible substrate 10 and may block a permeation of moisture and oxygen to the flexible substrate 10. A gate insulating layer 13 and an interlayer insulating layer 14 may function as an insulation layer. Edges of the gate insulating layer 13 and the interlayer insulating layer 14 may be partially eliminated. The gate insulating layer 13 and the interlayer insulating layer 14 may be disposed at an inner side of the crack suppressing layer 70. The gate insulating layer 13 and the interlayer insulating layer 14 may be disposed at a constant distance from the edge of the flexible substrate 10.

The edge of the gate insulating layer 13 and the edge of the interlayer insulating layer 14 may be disposed between the edge of the flexible substrate 10 and a thin film encapsulation layer 30. The crack suppressing layer 70 may contact the top surface of the exposed buffer layer 12 and a part of an upper portion of the interlayer insulating layer 14.

As the thickness of the inorganic layer 19 is decreased at the edge of the flexible substrate 10 corresponding to a cutting line CL, the flexible display 200 according to an exemplary embodiment of the present invention may suppress generation of cracks during a cutting process and suppress spread of the cracks during a process after the cutting process.

Figure 5A:
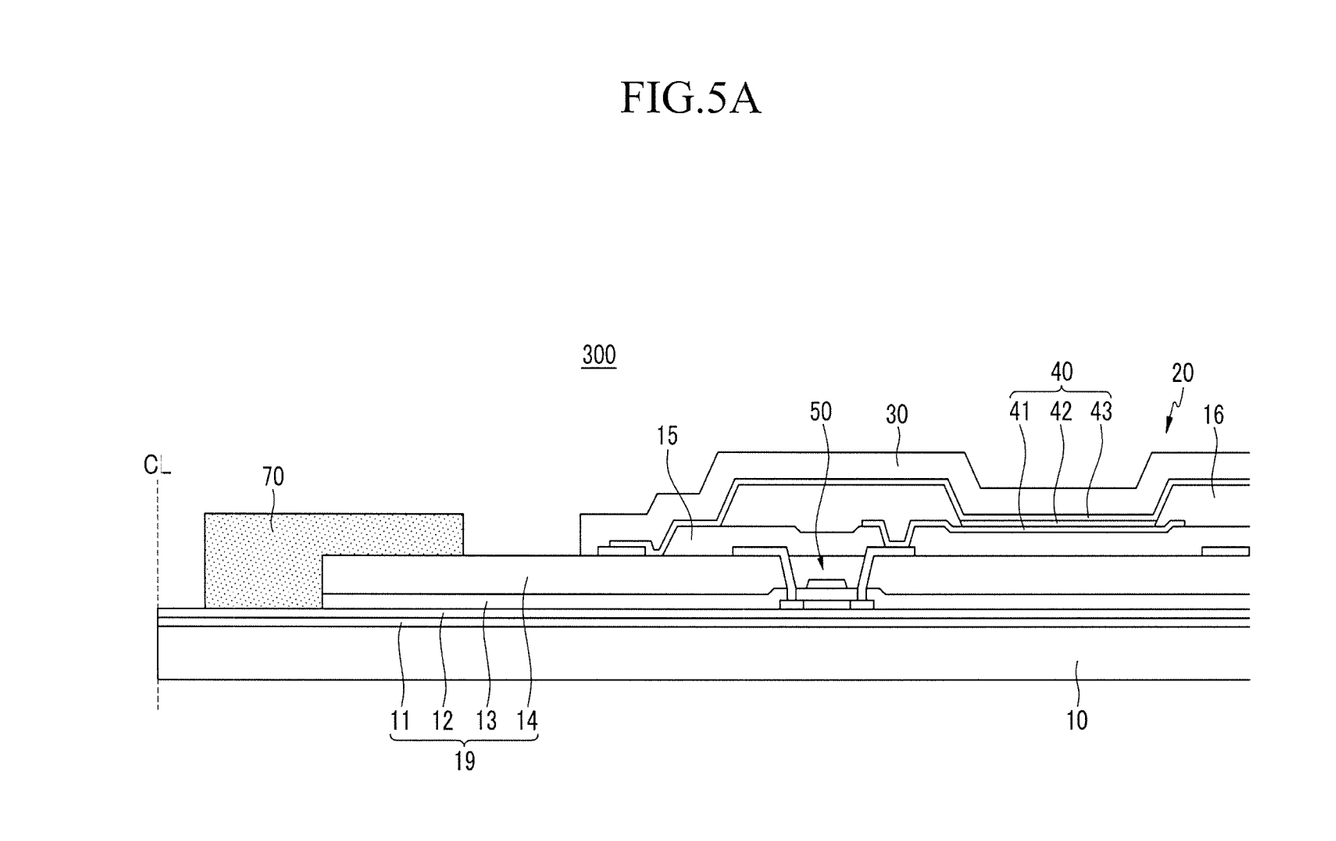
FIG. 5A and FIG. 5B are partially enlarged cross-sectional views of a flexible display according to an exemplary embodiment of the present invention.
Figure 5B:
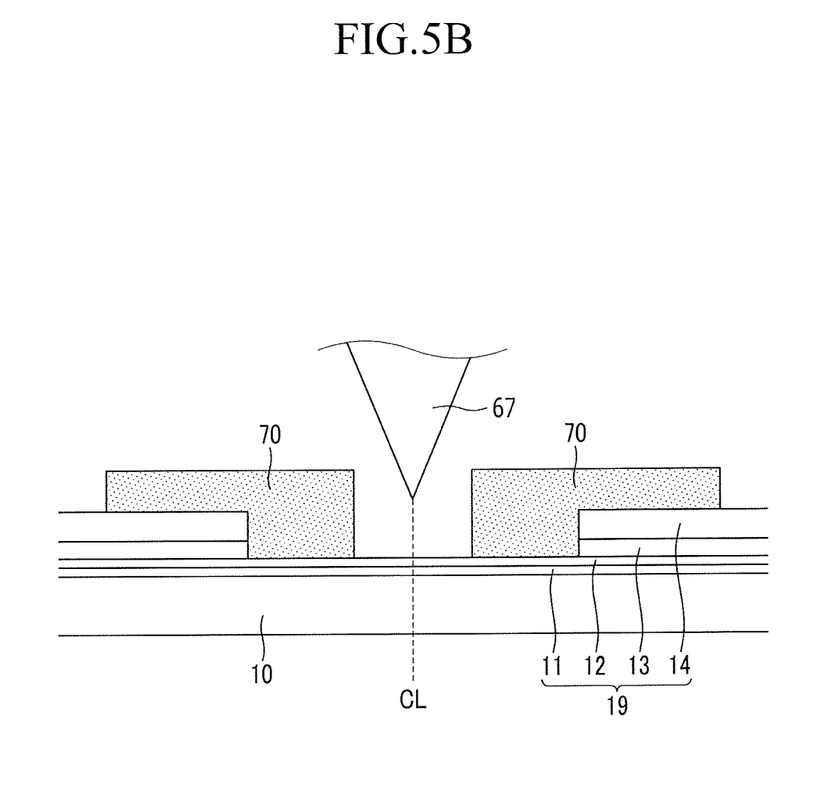

FIG. 5A and FIG. 5B are partially enlarged cross-sectional views of a flexible display according to an exemplary embodiment of the present invention.

Referring to FIG. 5A and FIG. 5B, a flexible display 300 according to an exemplary embodiment of the present invention is the same as the flexible display of the exemplary embodiment of FIGS. 1 and 2, except that a crack suppressing layer 70 is formed at an inner side of the flexible substrate 10 with a gap from the edge of a flexible substrate 10 to a side of the crack suppressing layer 70. The same reference numerals may be used for the same components as those of the exemplary embodiment of FIGS. 1 and 2.

When a gap between the cutting line CL and the crack suppressing layer 70 is relatively small and the flexible substrate 10 is disposed at an inner side of the crack with a constant gap between the edge of the flexible substrate 10 and the crack suppressing layer 70, a cutting knife 67 may contact the crack suppressing layers 70 at both sides of the cutting line CL during a cutting process. The crack suppressing layer 70 may function as a buffering member of the inorganic layer 19 disposed therebetween and minimize the generation of cracks in the inorganic layer 19. The crack suppressing layer 70 may minimize the generation of cracks in the inorganic layer 19 at a moment that the cutting knife 67 contacts the crack suppressing layer 70.

In the flexible display 300 according to an exemplary embodiment of the present invention, a part of the inorganic layer 19, for example, a part of a gate insulating layer 13 and a part of an interlayer insulating layer 14, may be eliminated and the gate insulating layer 13 and the interlayer insulating layer 14 may be formed at an inner side of the crack suppressing layer 70 between the edge of the flexible substrate 10 and the crack suppressing layer 70. The thickness of the inorganic layer 19 may decrease at the edge of the flexible substrate 10 so that the generation of cracks and the spread of the cracks may be suppressed.

Figure 6:
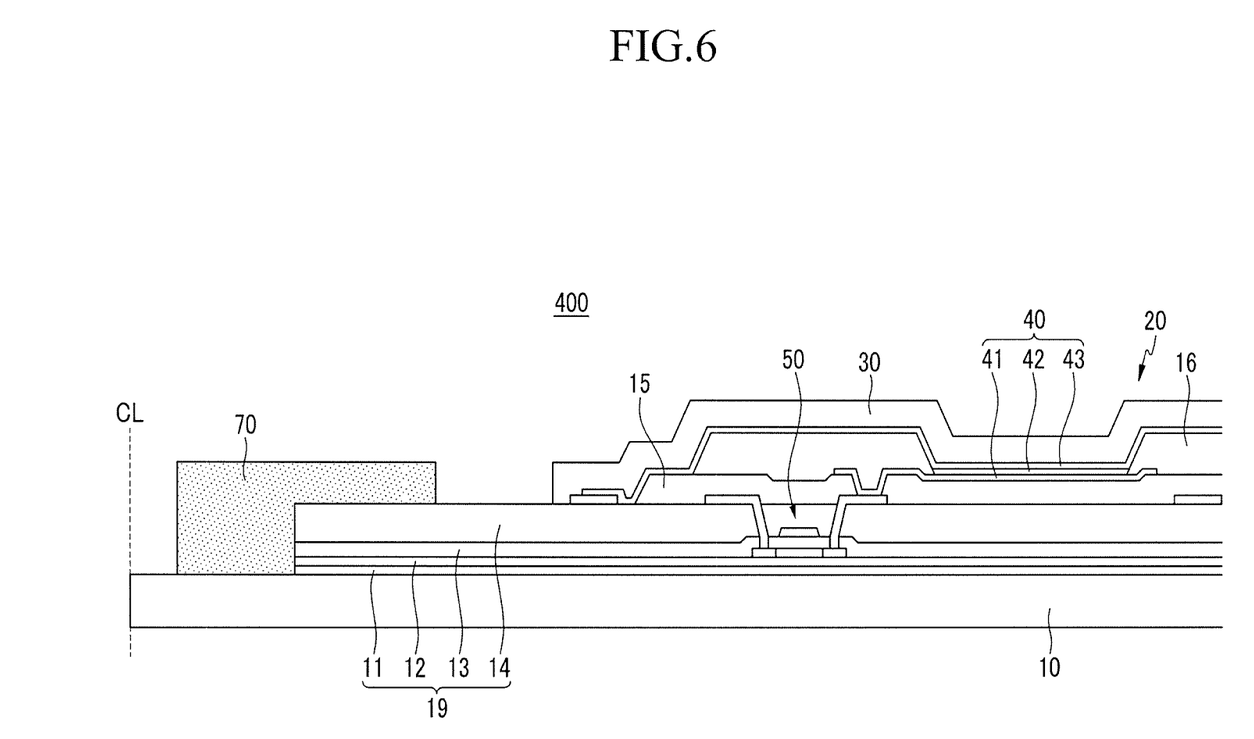
FIG. 6 is a partially enlarged cross-sectional view of a flexible display according to an exemplary embodiment of the present invention.

FIG. 6 is a partially enlarged cross-sectional view of a flexible display according to an exemplary embodiment of the present invention.

Referring to FIG. 6, a flexible display 400 according to an exemplary embodiment of the present invention is the same as the flexible display of the exemplary embodiment of FIGS. 5A and 5B, except that the entire inorganic layer 19 is formed at an inner side than a crack suppressing layer 70 between the edge of a flexible substrate 10 and the crack suppressing layer 70. The same reference numerals may be used to refer to the same components as those of the exemplary embodiment of FIGS. 5A and 5B.

A part of the entire inorganic layer 19 may be eliminated and the inorganic layer 19 may be disposed at an inner side of the crack suppressing layer 70 between the edge of the flexible substrate 10 and the crack suppressing layer 70. The flexible substrate 10 may be exposed around a cutting line CL, and the crack suppressing layer 70 may cover a side surface and a part of a top surface of the inorganic layer 19.

According to the exemplary embodiment of FIG. 6, the inorganic layer 19 may be eliminated around the cutting line CL, and the cutting knife 67 need not contact the inorganic layer 19 during a cutting process. The cutting knife 67 may contact the flexible substrate 10 and the crack suppressing layers 70 at both sides of the cutting line CL. The generation of cracks in the inorganic layer 19 during the cutting process may be minimized and the spread of the cracks after the cutting process may be substantially suppressed. The flexible display according to exemplary embodiments of the present invention may prevent damage to a thin film encapsulation layer 30 by cracking, and substantially prevent a loss of an encapsulation function of the thin film encapsulation layer 30.

While the present invention has been particularly shown and described with reference to exemplary embodiments thereof, it will be understood by those of ordinary skill in the art that various changes in form and detail may be made therein without departing from the spirit and scope of the present invention.

What is claimed is:

1. A flexible display, comprising:
   a flexible substrate;
   an inorganic layer disposed on the flexible substrate, wherein the inorganic layer comprises a barrier layer, a buffer layer, a gate insulating layer, and an interlayer insulating layer;
   a display unit disposed on the inorganic layer, wherein the display unit includes a plurality of pixels, each pixel thereof including an organic light emitting diode;
   a thin film encapsulation layer covering the display unit; and
   a crack suppressing layer formed along an edge of the flexible substrate, wherein the crack suppressing layer is disposed directly on the interlayer insulating layer of the inorganic layer at an exterior side of the thin film encapsulation layer, wherein the crack suppressing layer is configured to contact the edge of the flexible substrate, and the crack suppressing layer is disposed at an uppermost edge of the flexible substrate.

2. The flexible display of claim 1, wherein the barrier layer, the buffer layer, the gate insulating layer, and the interlayer insulating layer cover an entire top surface of the flexible substrate.

3. The flexible display of claim 1, wherein the barrier layer and the buffer layer cover an entire top surface of the flexible substrate, and the gate insulating layer and the interlayer insulating layer are disposed at an interior side of the crack suppressing layer, and the gate insulating layer and the interlayer insulating layer are disposed at a constant distance from the edge of the flexible substrate.

4. The flexible display of claim 1, wherein the barrier layer and the buffer layer cover an entire top surface of the flexible substrate, and the gate insulating layer and the interlayer insulating layer are disposed at an inner side of the crack suppressing layer at a constant distance from the edge of the flexible substrate.

5. The flexible display of claim 1, wherein the barrier layer, the buffer layer, the gate insulating layer, and the interlayer insulating layer are formed at an inner side of the crack suppressing layer between the edge of the flexible substrate and the crack suppressing layer.

6. The flexible display of claim 1, wherein the crack suppressing layer comprises an organic material.

7. The flexible display of claim 6, wherein the display unit comprises a planarization layer and a pixel defining layer, and the crack suppressing layer comprises a same material as the planarization layer or the pixel defining layer.

8. The flexible display of claim 7, wherein the crack suppressing layer comprises a first layer including a same material as the planarization layer and a second layer including a same material as the pixel defining layer.

9. The flexible display of claim 6, wherein the crack suppressing layer comprises at least one of a UV curable resin and a thermosetting resin.

10. A display device, comprising:
a flexible substrate;
an inorganic layer disposed on a portion of the flexible substrate, wherein the inorganic layer comprises a barrier layer, a buffer layer, a gate insulating layer, and an interlayer insulating layer, and wherein a portion of the flexible substrate is not covered by the inorganic layer;
a thin film encapsulation layer disposed over a display unit, wherein the display unit is disposed on the inorganic layer; and
a crack suppressing layer formed over the portion of the flexible substrate not covered by the inorganic layer, wherein the crack suppressing layer is disposed directly on the inorganic layer and the crack suppressing layer covers a side portion of the inorganic layer comprising the barrier layer, the buffer layer, the gate insulating layer and the interlayer insulating layer, and a top portion of the inorganic layer, wherein the crack suppressing layer is configured to prevent cracks from forming in the inorganic layer during a cutting process, wherein the crack suppressing layer is configured to contact the edge of the flexible substrate, and the crack suppressing layer is disposed at an uppermost edge of the flexible substrate.

11. The display of claim 10, further comprising an upper protection film disposed on the thin film encapsulation layer.

12. The display of claim 10, wherein the crack suppressing layer comprises a first layer and a second layer.

13. The display of claim 10, wherein the crack suppressing layer comprises a UV curable resin or a thermosetting resin.

14. The display of claim 10, wherein the crack suppressing layer comprises a sealant.

15. A flexible display, comprising:
a flexible substrate;
an inorganic layer disposed on the flexible substrate, wherein the inorganic layer comprises a barrier layer, a buffer layer, a gate insulating layer, and an interlayer insulating layer;
a display unit disposed on the inorganic layer, wherein the display unit includes a plurality of pixels, each pixel thereof including an organic light emitting diode;
a thin film encapsulation layer covering the display unit; and
a crack suppressing layer formed along an edge of the flexible substrate, wherein the crack suppressing layer is disposed directly on the interlayer insulating layer of the inorganic layer at an exterior side of the thin film encapsulation layer, and wherein the crack suppressing layer is formed at an inner side of the flexible substrate, and the crack suppressing layer covers a portion of the inorganic layer.

16. The flexible display of claim 15, wherein the barrier layer and the buffer layer cover an entire top surface of the flexible substrate, and the gate insulating layer and the interlayer insulating layer are disposed at an inner side of the crack suppressing layer at a constant distance from the edge of the flexible substrate.

17. The flexible display of claim 15, wherein the barrier layer, the buffer layer, the gate insulating layer, and the interlayer insulating layer are formed at an inner side of the crack suppressing layer between the edge of the flexible substrate and the crack suppressing layer.

* * * * *